(12) United States Patent
Nishi

(10) Patent No.: US 7,656,453 B2
(45) Date of Patent: Feb. 2, 2010

(54) SOLID-STATE IMAGING DEVICE HAVING CHARACTERISTIC COLOR UNIT DEPENDING ON COLOR, MANUFACTURING METHOD THEREOF AND CAMERA

(75) Inventor: Yoshiaki Nishi, Kyoto (JP)

(73) Assignee: Panasonic Corporation, Osaka (JP)

( * ) Notice: Subject to any disclaimer, the term of this patent is extended or adjusted under 35 U.S.C. 154(b) by 776 days.

(21) Appl. No.: 11/231,756

(22) Filed: Sep. 22, 2005

(65) Prior Publication Data
US 2006/0066922 A1 Mar. 30, 2006

(30) Foreign Application Priority Data
Sep. 24, 2004 (JP) .............................. 2004-278104

(51) Int. Cl.
H04N 5/225 (2006.01)
H04N 5/335 (2006.01)
(52) U.S. Cl. ........................ 348/340; 348/273
(58) Field of Classification Search ............... 348/266, 348/272, 273, 276, 277, 280, 335, 340
See application file for complete search history.

(56) References Cited

U.S. PATENT DOCUMENTS

| | | | |
|---|---|---|---|
| 6,271,900 B1 * | 8/2001 | Li | 349/95 |
| 6,734,031 B2 | 5/2004 | Shizukuishi | |
| 2003/0215967 A1 | 11/2003 | Shizukuishi | |
| 2004/0105021 A1 * | 6/2004 | Hu | 348/272 |

FOREIGN PATENT DOCUMENTS

| | | | |
|---|---|---|---|
| JP | 9-116127 | | 5/1997 |
| JP | 11-040787 | | 2/1999 |
| JP | 2002-151670 | * | 5/2002 |
| JP | 2003-204050 | | 7/2003 |
| JP | 2003-332547 | | 11/2003 |

OTHER PUBLICATIONS

Abstract and machine translation of claims 1-9 of JP 2002-151670, previously submitted in the IDS filed on Sep. 22, 2005.

* cited by examiner

*Primary Examiner*—Jason Chan
*Assistant Examiner*—Nicholas G Giles
(74) *Attorney, Agent, or Firm*—Wenderoth, Lind & Ponack, L.L.P.

(57) ABSTRACT

The solid-state imaging device of the present invention includes: light-receiving units formed on a semiconductor substrate; color filters respectively formed on corresponding light-receiving units; and in-layer lenses formed above the light-receiving units and below the color filters, in which the in-layer lenses have different curvature shapes depending on colors of the corresponding color filters.

5 Claims, 12 Drawing Sheets

Planarizing layer 25R
Planarizing layer 25G
Planarizing layer 25B

SOLID-STATE IMAGING DEVICE HAVING CHARACTERISTIC COLOR UNIT DEPENDING ON COLOR, MANUFACTURING METHOD THEREOF AND CAMERA

BACKGROUND OF THE INVENTION (1) Field of the Invention

The present invention relates to a solid-state imaging device and a camera that include a semiconductor substrate having plural light-receiving units, and lenses and color filters formed inside a layer, corresponding to the respective light-receiving units.

(2) Description of the Related Art

In recent years, with achievements of miniaturizing chip size and increasing the number of pixels of a solid-state imaging device, developments to achieve the miniaturization and high-performance of a digital camera, a digital movie camera, a camera-equipped cell phone and the like are proceeding.

A conventional solid-state imaging device has light-receiving units having respective micro-lenses in order to increase sensitivity, while the chip size is miniaturized and the number of pixels is increased in the solid-state imaging device.

While the microlenses are formed only on a top surface part of a chip in the conventional technology, it is getting difficult to obtain sufficient light-collecting efficiency only using the microlenses formed on the top surface part as the pixel size is further miniaturized. Accordingly, there is provided a solid-state imaging device in which in-layer lenses are formed between the microlens formed on the top surface part and the light-receiving units so that a higher light-collecting efficiency is achieved.

Also, along with the miniaturization of a camera, the development has been made to achieve short eye relief in a digital still camera, a camera-equipped cell phone and the like. Here, an exit pupil is a virtual image of a lens (or an aperture) seen from a light-receiving face side, and an eye relief is a distance from the light-receiving face to a virtual image point of the lens.

FIG. 1 is a cross-sectional drawing showing a camera part of a cell phone and the like for explaining an eye relief. In the drawing, a lens 80 is attached to a frame 81 of the cell phone which includes a Charge Coupled Device (CCD) image sensor 82 as a solid-state image device. An eye relief D is a distance between a virtual image point of the lens 80 and the CCD image sensor 82. By shortening the eye relief, light is incident vertically on a center part of the light-receiving face, while the light is incident not vertically but only diagonally on a peripheral part of the light-receiving face.

FIG. 2A and FIG. 2B are cross-sectional drawings, each of which shows a positional relationship between the light-receiving units and the microlenses in the conventional solid-state imaging device as disclosed, for example, in Japanese Patent Publication No. 11-40787. FIG. 2A shows a center part of an imaging area in which the light-receiving units are arranged in a two-dimensional array. FIG. 2B shows a peripheral part of the imaging area. Here, arrows in the drawings indicate incident light. The solid-state imaging device includes: a semiconductor substrate 101; light-receiving units 102 formed in the semiconductor substrate 101; transfer electrode units 103, each of which made up of a transfer electrode and a light-shielding film; in-layer convex lenses 104; a planarizing film 105 for planarizing the surfaces of the light-receiving units 102, the transfer electrode units 103 and the in-layer convex lenses 104; color filters 106R, 106G and 106B respectively for colors of red, green and blue; a planarizing film 107 under the microlenses 108; and microlenses 108. As the arrows indicate, the incident light is incident nearly vertical to the center part of the imaging area, while it is incident diagonally to the peripheral part as the eye relief is shorter.

FIG. 3 is a drawing showing a method of forming conventional in-layer convex lenses. As shown in FIG. 3(a), a transparent material 151 (e.g. plasma nitride film) is deposited using a Plasma Chemical Vapor Deposition (CVD) method. Next, as shown in FIG. 3(b), a resist is patterned on the transparent material 151 via a mask, and convex patterns 152 are formed on the resist by further performing reflow processing. Lastly, as shown in FIG. 3(c), the transparent material 151 deposited on the convex patterns 152 is etched so as to copy the shape of the convex patterns as masks, and the intra-convex lenses as shown in FIG. 3(d) are formed.

However, according to the conventional technology, the microlenses formed on the top surface part are formed in a same shape and made of a same material despite the color arrangements. The same thing applies to among the in-layer lenses. Therefore, different light-collecting effects are obtained depending on the wavelengths, causing a problem of worsening the sensitivity and color reproducibility.

Further, according to the conventional technology, there is a problem that color shading is generated in the peripheral part of the imaging area as shortening the eye relief. In other words, there is a problem that the peripheral part of the image is colored because of the collapse of the white balance.

It is because refractive indexes of the in-layer lenses are different depending on colors as well as those of the microlenses, which mean wavelengths, and the differences of the refractive indexes cause differences of light-collecting state on the light-receiving faces of respective color arrays. In the case where incident light spreads without being collected sufficiently on the light-receiving faces, the incident light is likely to be incident out of the light-receiving units so that the sensitivity is lowered. In the case where the light-collecting states on the light-receiving faces are different for respective color arrays, the color shading is generated because the differences of sensitivities among colors are generated.

SUMMARY OF THE INVENTION

Accordingly, considering the aforementioned problems, objects of the present invention are to provide a solid-state imaging device and a manufacturing method thereof, which increases sensitivity and color reproducibility, even in a further miniaturized pixel size, without damaging light-collecting effects for each color array, and is suitable for preventing a generation of color shading in a peripheral part of an imaging area and for shortening an eye relief.

In order to achieve the aforementioned objects, a solid-state imaging device according to the present invention includes: light-receiving units, each of which is operable to perform photoelectric conversion of light; and color units respectively corresponding to said light-receiving units, wherein each of said color units has any one color selected from a plurality of colors, and has a unique characteristic corresponding to the selected color, and the characteristic is at least one of a curvature shape and a refractive index.

Also, the solid-state imaging device according to the present invention includes, on a semiconductor substrate: light-receiving units; color filters, each of which is formed on a light-receiving unit corresponding to each of the light-receiving units; and in-layer lenses, each of which is placed above said light-receiving unit and below said color filter, and whose curvature shape is different depending on the selected color of said color filter.

Further, the solid-state imaging device according to the present invention includes, on a semiconductor substrate: light-receiving units; color filters, each of which is formed on a light-receiving unit corresponding to each of the light-receiving units; and in-layer lenses, each of which is placed above said light-receiving unit and below said color filter, wherein at least one of said in-layer lens and said film has a refractive index which is different depending on the selected color of said color filter.

Accordingly, even in the peripheral part of the imaging area, every color can be collected evenly at the light-receiving unit. In other words, neither at a deeper position nor shallower position from the light-receiving face, every light-receiving unit corresponding to any one of colors can collect the light most. As the result, the generation of color shading can be prevented. Therefore, shortening an eye relief can be easily encouraged.

Note that said in-layer lens may have one of an upward convex shape and an upward concave shape.

Note that said in-layer lens has an upward convex shape, each of said color filters has a color which is one of red, green and blue, and curvatures of said in-layer lenses respectively corresponding to red, green and blue color filters are preferred to be smaller in the order of red, green and blue.

Further, it is preferred that said in-layer lens has an upward concave shape, each of said color filters has a color which is one of red, green and blue, and curvatures of said films respectively corresponding to said red, green and blue color filters are smaller in the order of red, green and blue.

It should be noted that at least part of the film formed on a layer directly on the in-layer lens is made of a color material, and has a function as a color filter which passes through a specific optical wavelength band. Accordingly, more simplified process is allowed.

Here, the in-layer lenses are preferred to be formed through exposure and development using a gradation mask which has a mask pattern which has a mask pattern that is changed depending on the color of each color filter.

Further, the solid-state imaging device according to the present invention includes, on a semiconductor substrate: light-receiving units; and in-layer lenses, each of which has any one color selected from the plurality of colors, wherein one of a curvature shape and a refractive index of said in-layer lens is different depending on the selected color of said in-layer lens.

Furthermore, in a manufacturing method of a solid-state imaging device according to the present invention, a shape of a lens formed in the layer is changed depending on each color arrangement by changing a mask pattern depending on the color arrangement. Here, each of said in-layer lenses is preferred to be formed through exposure and development using the gradation mask which has a mask pattern that is changed depending on the color of each in-layer lens.

Accordingly, an in-layer lens is formed by changing patterns on the mask for each color array so that it is manufactured without increasing the number of man-hours. Also, the shape of the in-layer lens can be changed easily.

Further, a camera according to the present invention includes a solid-state imaging device according to the present invention.

Accordingly, a solid-state imaging device and a camera which have good sensitivity and color reproducibility, and generates less color shading can be realized.

As described in the above, according to the solid-state imaging device of the present invention, the sensitivity and color reproducibility can be increased without damaging light-collecting effects of each color. Further, even in a peripheral part of the imaging area, every color can be collected evenly at a respective light-receiving unit. In other words, neither at a deeper position nor shallower position from the light-receiving face, every light-receiving unit corresponding to any one of colors can collect the light most. As the result, the generation of color shading can be prevented. Therefore, shortening an eye relief can be easily encouraged.

As further information about technical background to this application, the disclosure of Japanese Patent Application No. 2004-278104 filed on Sep. 24, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the drawings.

DESCRIPTION OF THE PREFERRED EMBODIMENT

First Embodiment

Figure 1:
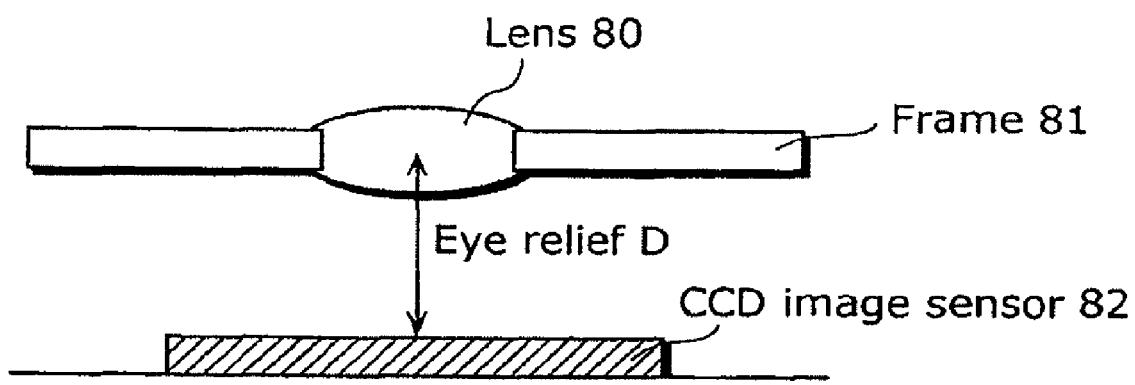
FIG. 1 is a drawing showing a cross-section of a camera part of a cell phone and the like for explaining an eye relief.
Figure 2B:
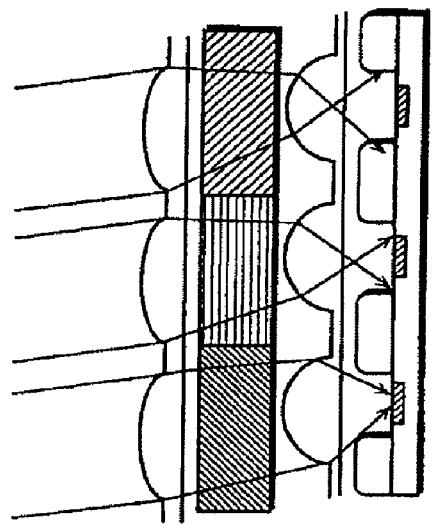
FIG. 2A and FIG. 2B are drawings showing cross-sections of a conventional solid-state imaging device.
Figure 2A:
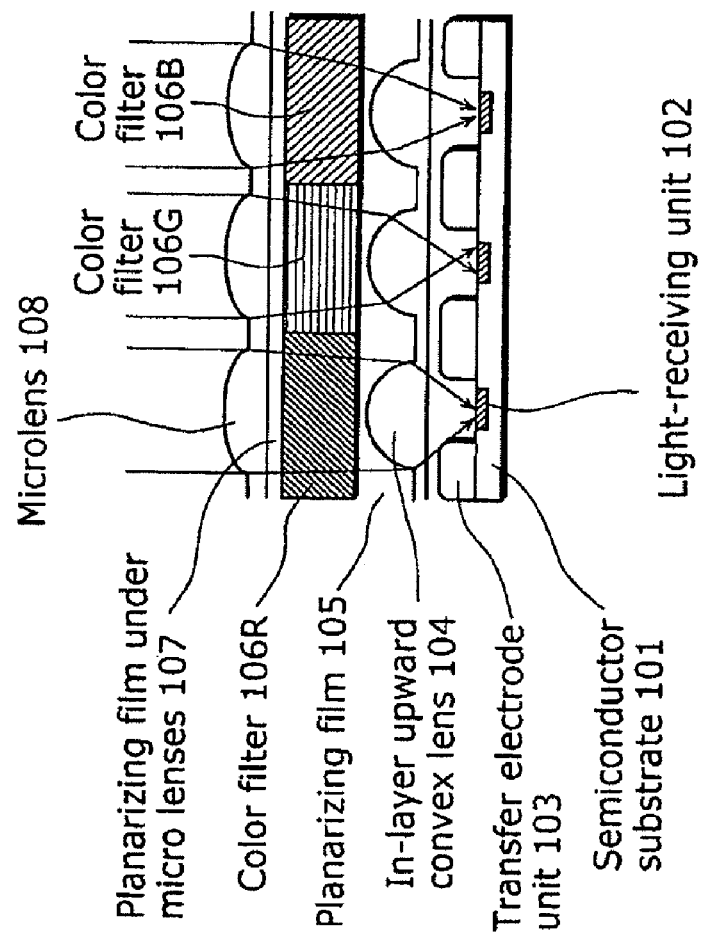
Figure 3:
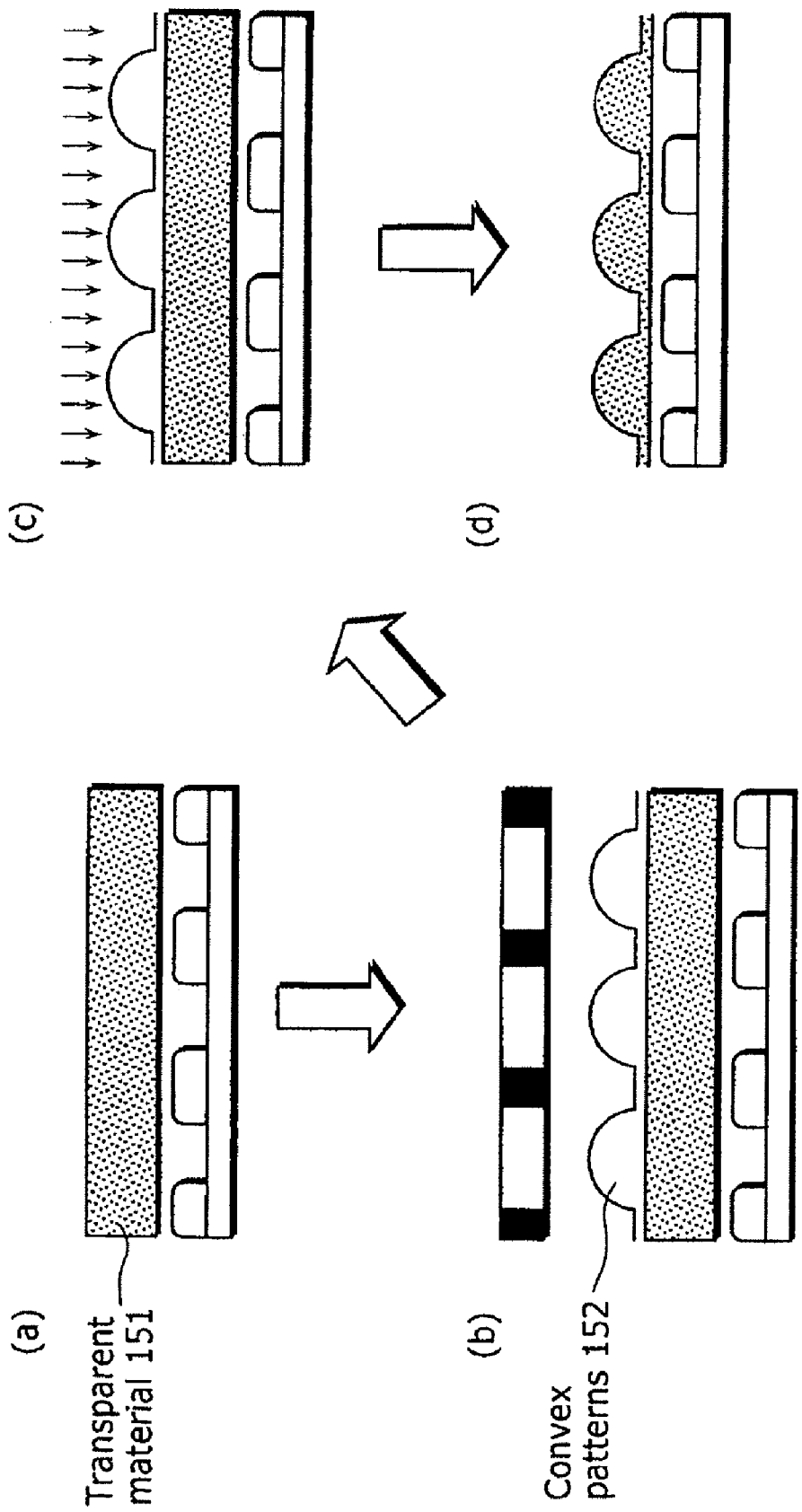
FIG. 3 is a drawing showing a method of manufacturing the conventional solid-state imaging device.
Figure 4B:
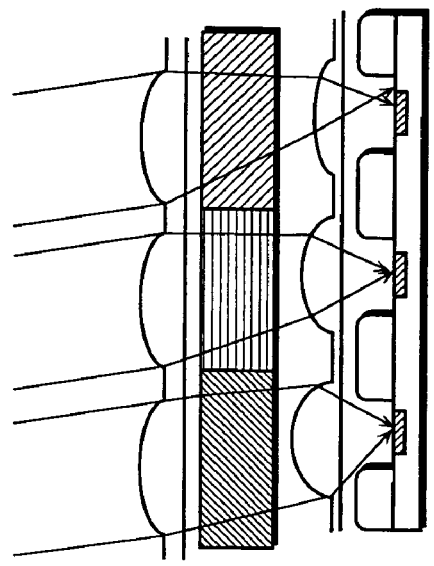
FIG. 4A and FIG. 4B are drawings showing cross-sections of a solid-state imaging device according to an embodiment of the present invention.
Figure 4A:
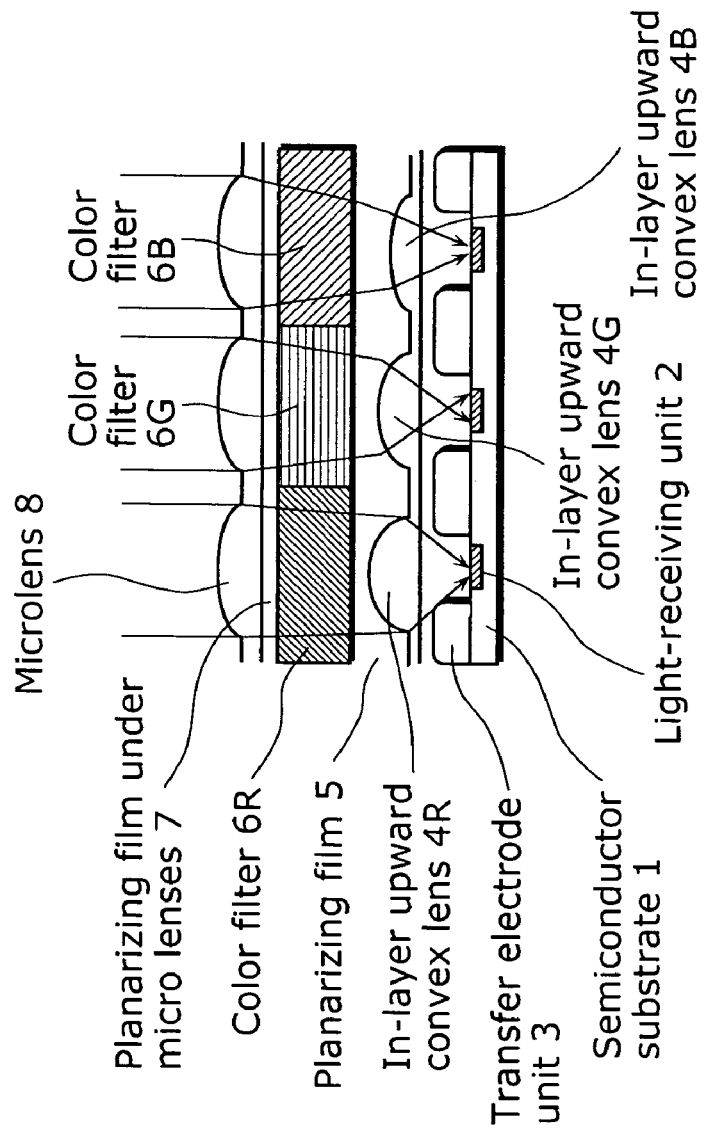

FIGS. 4A and 4B are drawings showing cross-sections of a solid-state imaging device according to an embodiment of the present invention. FIG. 4A shows a center part of an imaging area in which light-receiving units are arranged in a two-dimensional array. FIG. 4B shows a peripheral part of the imaging area. Also, arrows in the drawings indicate incident light.

As shown in the drawings, the solid-state imaging device includes: a semiconductor substrate 1; light-receiving units 2 formed in the semiconductor layer 1; transfer electrode units 3; in-layer convex lenses 4R, 4G and 4B that are made of a plasma nitride film (refractive index n=1.9) transparent under visible light, and are different in size for respective color arrays; a planarizing film 5 made of acrylic resin (refractive index n=1.5) transparent under visible light; color filters 6R, 6G and 6B; a planarizing film 7 under microlenses; and microlenses 8 made of acrylic resin transparent under visible light. With this structure, it operates as a light-collecting lens using the differences of refractive indexes between air and the microlens 8. Also, it operates as a light-collecting lens using differences of refractive indexes between the planarizing film 5 and the in-layer convex lens 4. Here, the acrylic resin which forms the micro-lenses 8 has a refractive index which is different depending on a wavelength. In general, the refractive index is higher as the wavelength is shorter. Therefore, the light-collecting effects of the microlenses are stronger in the order of red, green and blue. Accordingly, in order to collect light most at the light-receiving face in any light-receiving units corresponding to respective colors, in the case where bottom levels of the in-layer convex lenses 4R, 4G and 4B are at the same level, the light-receiving units 2 respectively corresponding to the red color filter 6R, the green color filter 6G and the blue color filter 6B are structured to have the same light-collecting state by changing heights of the in-layer convex lenses so as to have different heights for respective color arrays, in other words by lowering the heights in the order of 4R, 4G and 4B, and decreasing the curvatures. Further, with this structure, any color of incident light can be evenly collected at a respective light-collecting unit even in the peripheral part of the imaging area.

Figures 5A, 5B:
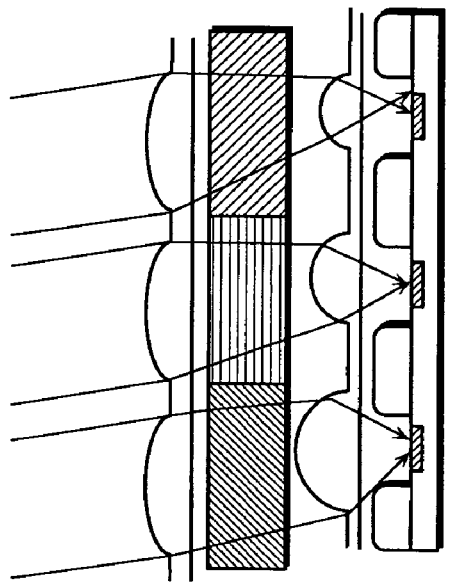
FIGS. 5A and 5B are drawings showing cross-sections of a solid-state imaging device according to a first variation.

FIGS. 5A and 5B are drawings showing cross-sections of a solid-state imaging device according to a first variation of the present invention. FIG. 5A shows a center part of the imaging area in which the light-receiving units are arranged in a two-dimensional array. FIG. 5B shows the peripheral part of the imaging area. Also, arrows in the drawings indicate incident light.

As shown in the drawings, it differs from the example shown in FIGS. 4G and 4B in that it includes in-layer convex lenses 14R, 14G and 14B not only whose heights are changed but also whose widths are changed. Thus, by changing the widths and controlling the curvatures, the light-receiving units respectively corresponding to the red color filter 6R, the green color filter 6G and the blue color filter 6B can be structured more efficiently to have the same light-collecting state. Further, with this structure, any color of incident light is evenly collected at a respective light-collecting unit even in the peripheral part of the imaging area.

It should be noted that the solid-state imaging device shown in FIGS. 4A, 4B, 5A and 5B has a structure in which height and width of the in-layer convex lenses are different for respective color arrays. However, unless the light-collecting units 2 respectively corresponding the red color filter 6R, the green color filter 6G, and the blue color filter 6B are structured to have the same light-collecting state, the curvatures or the shapes may be changed to be different from each other for respective color arrays.

Figure 6:
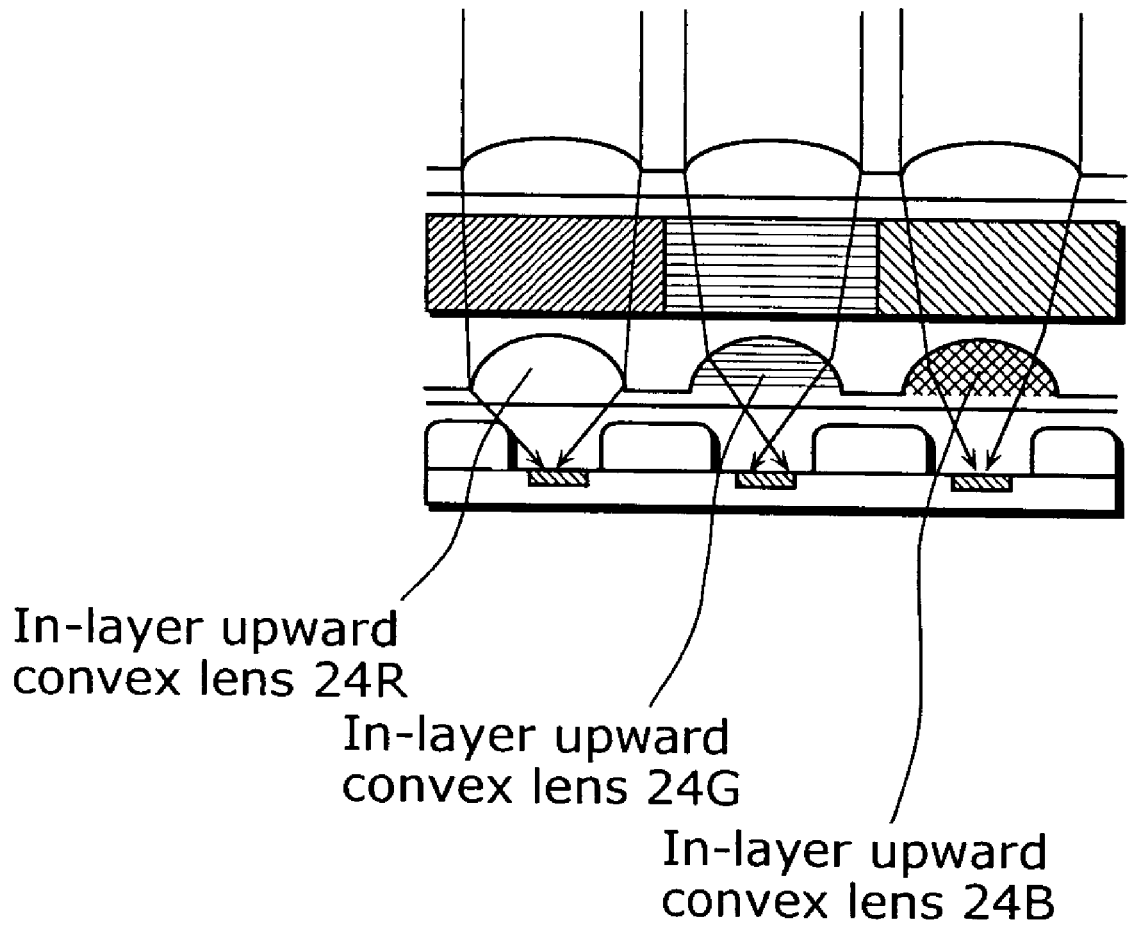
FIG. 6 is a drawing showing a cross-section of a solid-state imaging device according to a second variation.

FIG. 6 is a drawing showing a cross-section of a solid-state imaging device according to a second variation of the present invention. In the drawing, arrows indicate incident light.

As shown in the drawing, it differs from the embodiment shown in FIG. 4A and FIG. 4B in that not the shapes but materials are different for respective in-layer convex lenses 24R, 24G and 24B. Thus, by having the in-layer convex lenses 24R, 24G and 24B whose materials which mean refractive indexes are different for respective color arrays, in other words, by selecting materials whose refractive indexes are smaller in the order of 24R, 24G and 24B, the light-receiving units 2 respectively corresponding to the red color filter.6R, the green color filter 6G, and the blue color filter 6B are structured to have the same light collecting state.

Figure 7B:
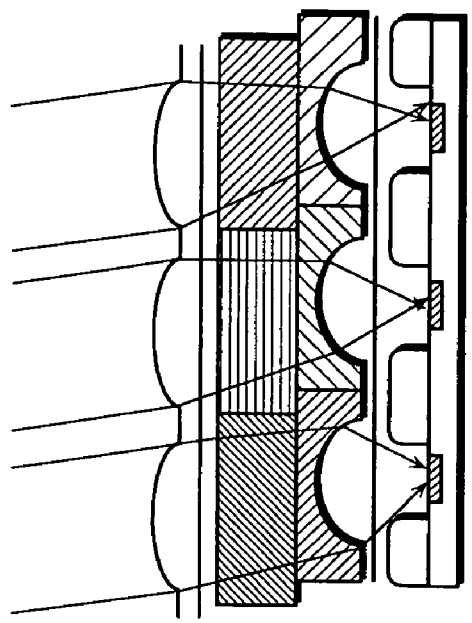
FIGS. 7A and 7B are drawings showing cross-sections of a solid-state imaging device according to a third variation.
Figure 7A:
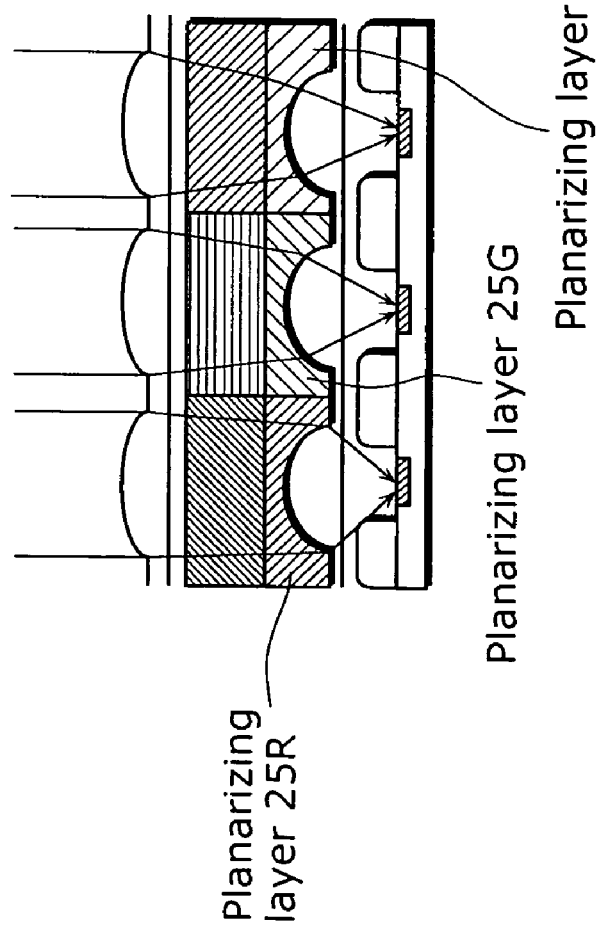

FIG. 7A and FIG. 7B are drawings showing cross-sections of a solid-state imaging device according to a third variation of the present invention. FIG. 7A shows a center part of an imaging area in which light-receiving units are arranged in a two-dimensional array. FIG. 7B shows a peripheral part of the imaging area. Also, arrows in the drawings indicate incident light.

As shown in the drawings, it differs from the embodiment shown in FIG. 4A and FIG. 4B in that, while the sizes of the in-layer convex lenses are the same, materials (refractive indexes) of planarizing layers formed on the in-layer convex lenses are different for respective color arrays. The different planarizing layers can be easily formed by selectively patterning each of the materials. Thus, by having the in-layer convex lenses 25R, 25G and 25B whose materials which mean refractive indexes are different for respective color arrays, in other words, by selecting materials whose refractive indexes are higher in the order of 25R, 25G and 25B, the light-receiving units 2 respectively corresponding to the red color filter 6R, the green color filter 6G, and the blue color filter 6B are structured to have the same light collecting state. Further, with this structure, any color of incident light is evenly collected at a respective light-collecting unit even in the peripheral part of the imaging area.

Figure 8:
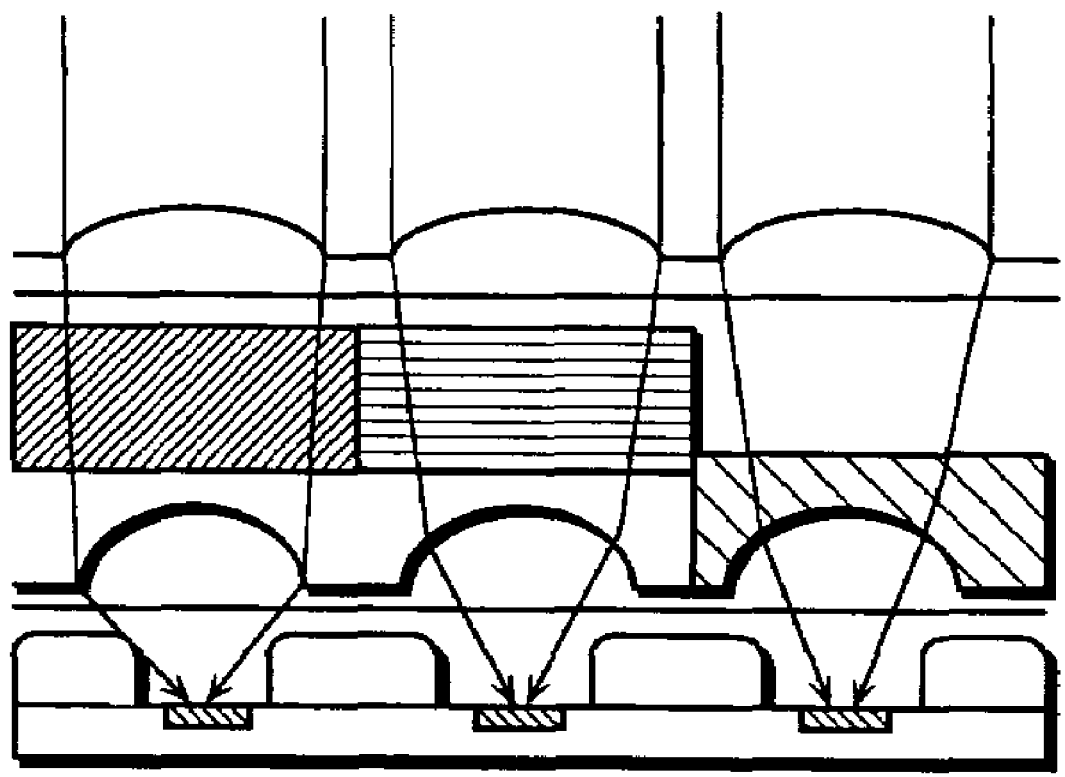
FIG. 8 is a drawing showing a cross-section of a solid-state imaging device according to a fourth variation.

FIG. 8 is a drawing showing a cross-section of a solid-state imaging device according to a fourth variation of the present invention. In the drawing, arrows indicate incident light.

As shown in the drawing, it differs from the embodiment shown in FIG. 7A and FIG. 7B in that at least one color of the planarizing films 25 is a color material. If any color can be evenly collected by a respective light-receiving unit, it is possible to select a color material to the planarizing film. Accordingly, the process can be simplified.

Figure 9:
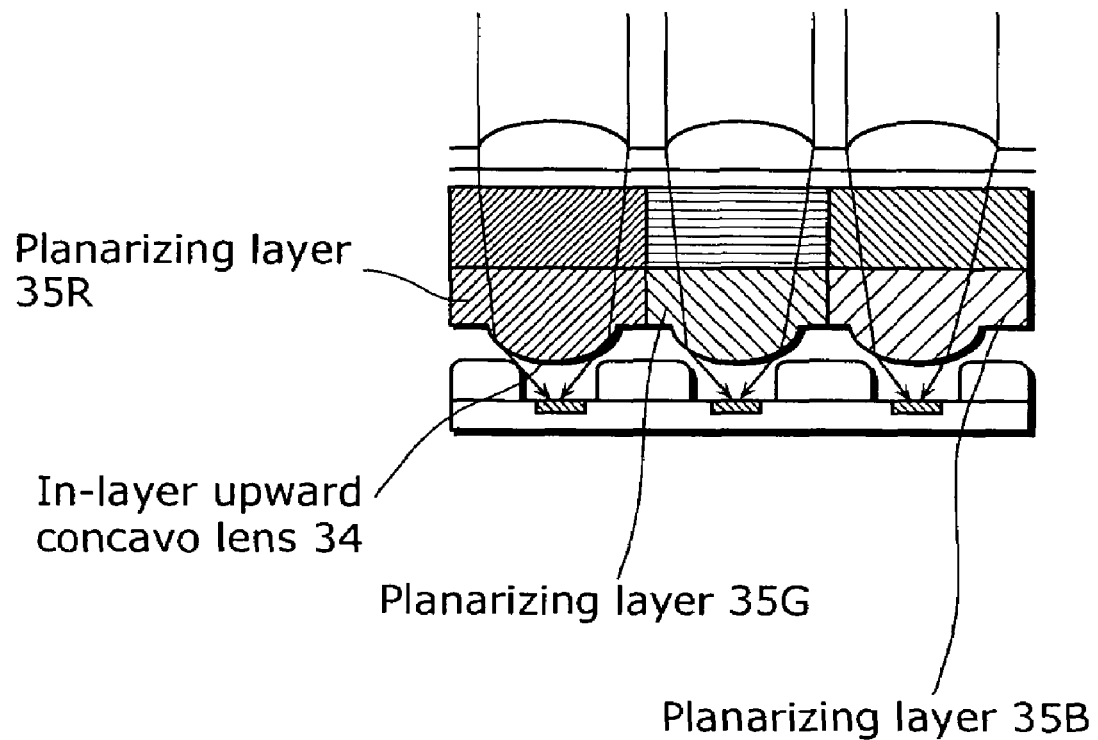
FIG. 9 is a drawing showing a cross-section of a solid-state imaging device according to a fifth variation.

It should be noted that the solid-state imaging devices shown in FIGS. 7A and 7B, and FIGS. 8A and 8B have a structure of having in-layer convex lenses. Here, not to mention that similar effect can be obtained even in the structure of having in-layer upward concave lens by changing materials which mean refractive indexes, of the planarizing films formed on the in-layer upward concave lens to be different for respective color arrays. FIG. 9 shows an example of the above.

FIG. 9 is a drawing showing a cross-section of a solid-state imaging device according to a fifth embodiment of the present invention. In the drawing, arrows indicate incident light. It has a structure in which planarizing films 35R, 35G and 35B whose materials are different which mean refractive indexes are different for respective color arrays are formed on the in-layer upward concave lens.

Figure 10A:
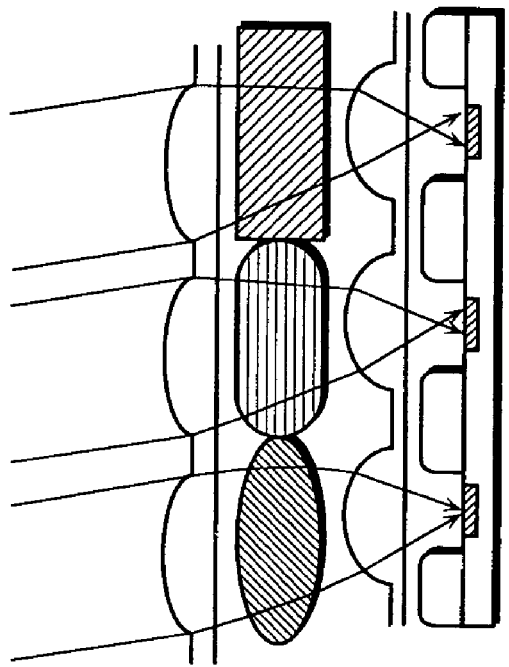
FIGS. 10A and 10B are drawings showing cross-sections of a solid-state imaging device according to a sixth variation.
Figure 10B:
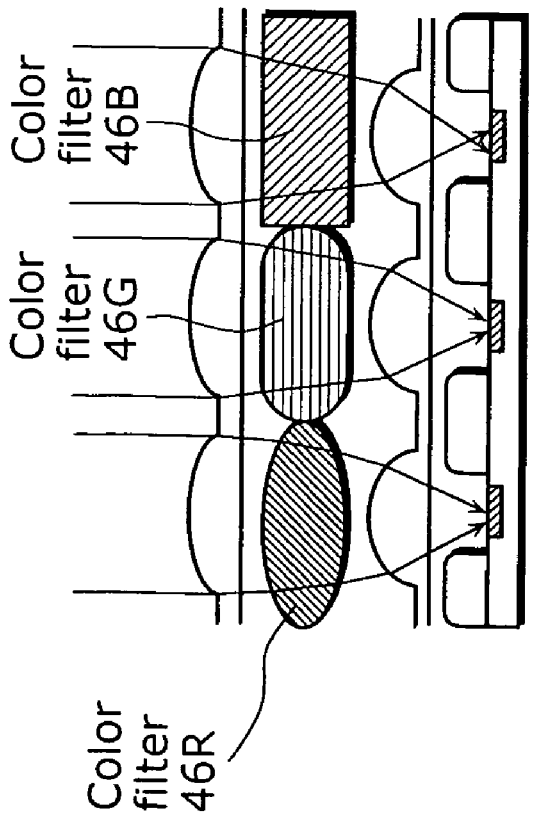

FIG. 10A and FIG. 10B are drawings showing cross-sections of a solid-state imaging device according to a sixth embodiment of the present invention. FIG. 10A shows a center part of an imaging area in which light-receiving units are arranged in a two-dimensional array. FIG. 10B shows a peripheral part of the imaging area. Here, arrows in the drawing indicate incident light.

As shown in the drawings, the sixth embodiment differs from the embodiment shown in FIG. 4A and FIG. 4B in that the sizes of the in-layer convex lenses are the same, the color filters function as light-collecting lens, and each of the color filters has a different shape. The color filters are made of a material of which a pigment is dispersed in acrylic resin and its refractive index n is 1.55. The color filters can be functioned as light-collecting lens using differences of refractive indexes between the planarizing films 5 made of acrylic resin (refractive index n=1.5) transparent under visible light and the planarizing films 7 under microlens.

Thus, by having the color filters 46R, 46G and 46B whose shapes are different for respective color arrays, in other words, by decreasing the curvatures in the order of 46B, 46G and 46R so as to make them rounder, the light-receiving units 2 respectively corresponding to the red color filter 6R, the green color filter 6G, and the blue color filter 6B are structured to have the same light collecting state. Further, with this structure, any color of incident light is evenly collected at a respective light-collecting unit even in the peripheral part of the imaging area.

It should be noted that, while, in the solid-state imaging device shown in FIG. 10A and FIG. 10B, the shapes of the color filters which function as light-collecting lens are changed for respective colors, the materials of the color filters (refractive indexes) may be changed unless the light-receiving units 2 respectively corresponding to the red color filter 6R, the green color filter 6G and the blue color filter 6B are structured to have the same light collecting state.

Figure 11B:
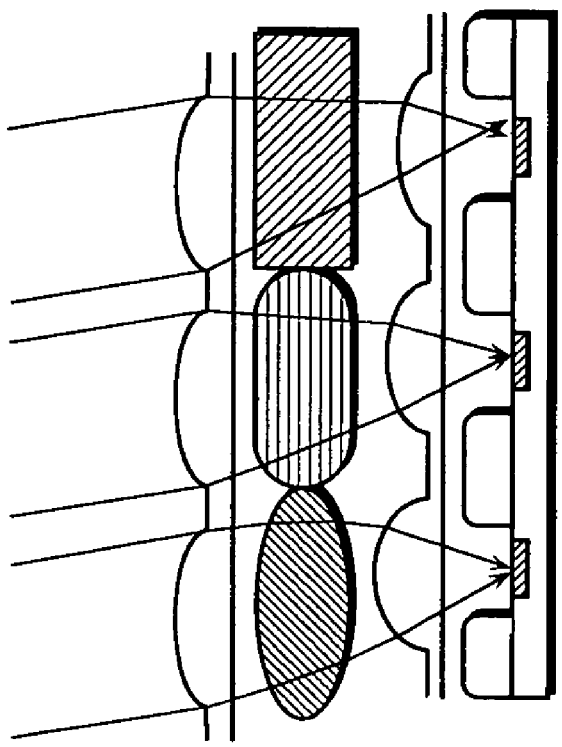
FIGS. 11A and 11B are drawings showing cross-sections of a solid-state imaging device according to a seventh variation.
Figure 11A:
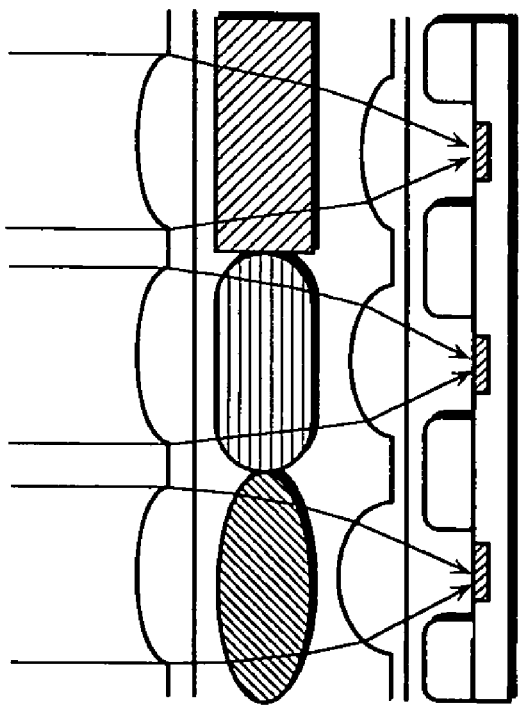

FIG. 11A and FIG. 11B are drawings showing cross-sections of a solid-state imaging device according to a seventh embodiment of the present invention. FIG. 11A shows a center part of an imaging area in which the light-receiving units are arranged in a two-dimensional array. FIG. 11B shows a peripheral part of the imaging area. Here, arrows in the drawing indicate incident light.

As shown in the drawings, the seventh embodiment differs from the embodiments shown in FIGS. 4A and 4B and FIGS. 10A and 10B in that not only the heights of the in-layer convex lenses, but also the shapes of the color filters which function as light-collecting lenses are different for respective colors. Thus, by changing the shapes of the light-collecting lenses so as to be different for respective color arrays, the light-receiving units 2 respectively corresponding to the red color filter 6R, the green color filter 6G and the blue color filter 6B can be more effectively structured to have the same light collecting state. Further, with this structure, any color of incident light is evenly collected at a respective light-collecting unit even in the peripheral part of the imaging area. Furthermore, the characteristics are more stabilized so that the improvements of sensitivity, color reproducibility and color shading can be expected.

It should be noted that in the solid-state imaging device shown in FIG. 11A and FIG. 11B, the shapes of the in-layer convex lenses and the color filters which function as light-collecting lens are different for respective colors. The shapes of the in-layer convex lenses and the microlenses may be changed so as to be different for respective color arrays, or the shapes or materials (refractive indexes) of three types of light-collecting lenses of the in-layer convex lenses, color filters which function as light-collecting lens and microlens may be changed so as to be different for respective color arrays unless the light-receiving units 2 respectively corresponding to the red color filter 6R, the green color filter 6G and the blue color filter 6B are structured to have the same light collecting state.

(Manufacturing Method of Solid-State Imaging Device)

Figure 12:
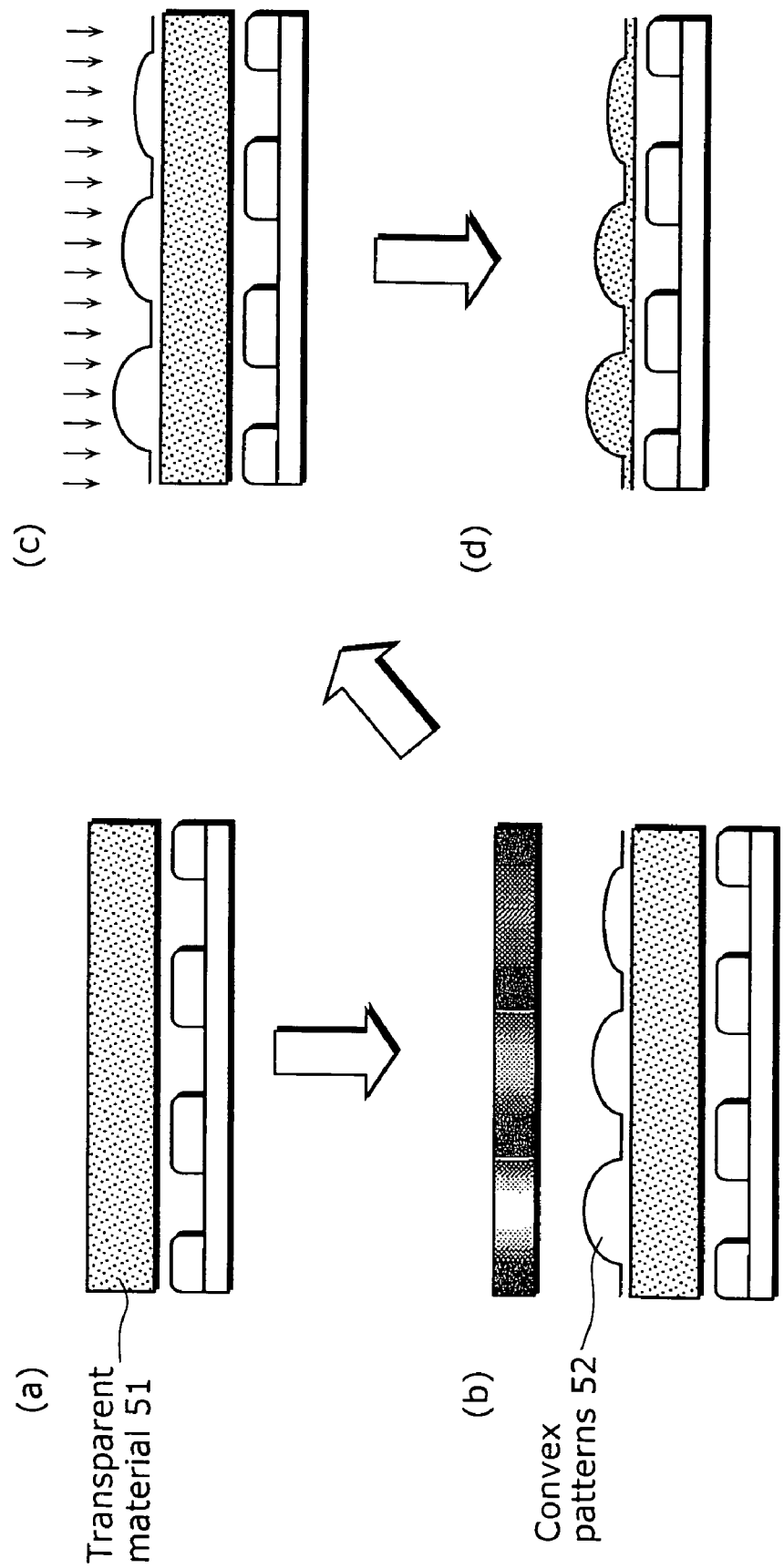
FIG. 12 is a drawing showing a method of manufacturing the solid-state imaging device according to the embodiment of the present invention.

FIG. 12 is a drawing showing cross-sections of a manufacturing method of the solid-state imaging device according to the present embodiment. Hereafter, the manufacturing processes are explained.

First, as shown in FIG. 12(a), a transparent material 51 (e.g. plasma nitride film) is deposited using the plasma CDV method. Next, as shown in FIG. 12(b), a resist is patterned on the transparent material 51 via masks whose pattern shapes are different for respective color arrays, and upward convex patterns 52 are formed by further performing reflow processing. In the present embodiment, it is possible to change the heights so as to be different for respective color arrays using gradation masks. Lastly, as shown in FIG. 12(c), the transparent material 51 is etched and transferred on the convex patterns 52 using the convex patterns 52 as masks and in-layer convex lens whose shapes are different for respective color arrays are formed as shown in FIG. 12(d).

It should be noted that, while FIG. 12 shows an example of having different heights of in-layer convex lenses, masks whose patterns are changed for respective color arrays may be used so as to change the widths as shown in FIG. 5A and FIG. 5B. Also, while convex lenses are used in FIG. 12, the lens shapes may be concave lenses according to the pattern changes of the gradation masks.

As described in the above, in the manufacturing method of the solid-state imaging apparatus according to the embodiment of the present invention, in-layer convex lenses having different shapes for respective color arrays can be formed easily so that the incident light passing through any color filters is collected at the light-receiving face both in the center part and peripheral part of the imaging area. Therefore, there are no differences of light-collectivity among different colors and color shading in the peripheral area can be prevented.

It should be noted that, while the solid-state imaging device in the present embodiment includes color filters of three colors (primary colors) of red, green and blue, there is no doubt that the similar effect can be expected in the solid-state imaging device which includes color filters of four colors (complementary colors) of yellow, cyan, magenta and green.

Further, by applying the solid-state imaging device to a digital still camera and digital movie camera, a camera which has good sensitivity and color reproducibility and causes less color shading can be realized.

The present invention is suitable to a solid-state imaging apparatus having microlenses and color filters respectively for light-receiving units formed on a semiconductor substrate, a manufacturing method thereof and a camera having the solid-state imaging device. For example, it is applicable to a CCD image sensor, a Metal Oxide Semiconductor (MOS) image sensor, a digital still camera, a camera-equipped cell phone, a camera installed in a lap top computer, a camera unit connected to an information processing appliance and the like.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A solid-state imaging device comprising:
   a plurality of light-receiving units, each of which is operable to perform photoelectric conversion of light; and
   a plurality of color units respectively corresponding to said light-receiving units,
   wherein each of said color units comprises:
   a color filter having any one color selected from a plurality of colors; and
   an in-layer lens located above a respective one of said light-receiving units and below said color filter,
   wherein the in-layer lens of at least one of said color units has an upward convex shape, and wherein said color filter has a shape of lens and a curvature shape that is different depending on the selected color of said color filter.

2. The solid-state imaging device according to claim 1, wherein a curvature of said in-layer lens is different depending on the selected color of said color filter.

3. The solid-state imaging device according to claim 1, wherein the in-layer lens of at least one of said color units has an upward concave shape.

4. The solid-state imaging device according to claim 1, wherein each of said color filters has a color which is one of red, green, and blue, and curvatures of said color filters respectively corresponding to red, green, and blue color filters are smaller in the order of red, green, and blue.

5. The solid-state imaging device according to claim 1, wherein each of said color filters has a color which is one of red, green, and blue, and curvatures of said in-layer lenses respectively corresponding to red, green, and blue color filters are smaller in the order of red, green, and blue.

* * * * *

UNITED STATES PATENT AND TRADEMARK OFFICE
CERTIFICATE OF CORRECTION

| | | |
|---|---|---|
| PATENT NO. | : 7,656,453 B2 | Page 1 of 1 |
| APPLICATION NO. | : 11/231756 | |
| DATED | : February 2, 2010 | |
| INVENTOR(S) | : Yoshiaki Nishi | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1168 days.

Signed and Sealed this

Twenty-eighth Day of December, 2010

David J. Kappos
*Director of the United States Patent and Trademark Office*